(12) United States Patent
Kikitsu et al.

(10) Patent No.: US 11,049,818 B2
(45) Date of Patent: *Jun. 29, 2021

(54) ELECTROMAGNETIC WAVE ATTENUATOR AND ELECTRONIC DEVICE

(71) Applicants: KABUSHIKI KAISHA TOSHIBA, Tokyo (JP); SHIBAURA MECHATRONICS CORPORATION, Yokohama (JP)

(72) Inventors: Akira Kikitsu, Kanagawa (JP); Yoshinari Kurosaki, Kanagawa (JP); Kenichiro Yamada, Tokyo (JP); Shigeki Matsunaka, Kanagawa (JP)

(73) Assignees: KABUSHIKI KAISHA TOSHIBA, Tokyo (JP); SHIBAURA MECHATRONICS CORPORATION, Yokohama (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/564,008

(22) Filed: Sep. 9, 2019

(65) Prior Publication Data

US 2020/0243457 A1  Jul. 30, 2020

(30) Foreign Application Priority Data

Jan. 28, 2019  (JP) .............................. JP2019-012148

(51) Int. Cl.
*H01L 23/552* (2006.01)
*H01L 43/02* (2006.01)

(52) U.S. Cl.
CPC ............ *H01L 23/552* (2013.01); *H01L 43/02* (2013.01)

(58) Field of Classification Search
CPC .............................. H01L 23/552; H01L 43/02
See application file for complete search history.

(56) References Cited

U.S. PATENT DOCUMENTS 5,663,857 A * 9/1997 Kumura ................. G11B 5/313
360/119.1
2001/0053051 A1* 12/2001 Umehara ............. G11B 5/3903
360/318.1
(Continued)

FOREIGN PATENT DOCUMENTS

JP    S61-237500 A   10/1986
JP    S62-256498 A   11/1987
(Continued)

*Primary Examiner* — Herve-Louis Y Assouman
(74) *Attorney, Agent, or Firm* — Finnegan, Henderson, Farabow, Garrett & Dunner L.L.P.

(57) ABSTRACT

According to one embodiment, an electromagnetic wave attenuator includes a multilayer member, and a magnetic member. The multilayer member includes a plurality of magnetic layers and a plurality of nonmagnetic layers. The plurality of nonmagnetic layers is conductive. A direction from one of the plurality of magnetic layers toward an other one of the plurality of magnetic layers is aligned with a first direction from the multilayer member toward the magnetic member. One of the plurality of nonmagnetic layers is between the one of the plurality of magnetic layers and the other one of the plurality of magnetic layers. A thickness along the first direction of the magnetic member is not less than ½ of a thickness along the first direction of the multilayer member.

19 Claims, 10 Drawing Sheets

(56) References Cited

U.S. PATENT DOCUMENTS

| | | |
|---|---|---|
| 2005/0162249 A1 | 7/2005 | Simola |
| 2010/0165510 A1* | 7/2010 | Takahashi ................ G11B 5/66 360/135 |
| 2010/0247964 A1* | 9/2010 | Onoue ..................... G11B 5/82 428/800 |
| 2010/0276791 A1* | 11/2010 | Kaneko ............... H01L 23/5227 257/659 |
| 2012/0019959 A1* | 1/2012 | Kurita ..................... G11B 5/65 360/110 |
| 2013/0256819 A1 | 10/2013 | Watanabe et al. |
| 2014/0004387 A1* | 1/2014 | Inturi ..................... H01F 10/16 428/826 |
| 2014/0374860 A1* | 12/2014 | Suzuki ................. H01L 27/228 257/422 |
| 2018/0337139 A1 | 11/2018 | Kikitsu et al. |
| 2019/0081007 A1 | 3/2019 | Iwasaki et al. |
| 2020/0227358 A1* | 7/2020 | Kikitsu ............... H05K 9/0088 |

FOREIGN PATENT DOCUMENTS

| | | |
|---|---|---|
| JP | H2-172299 A | 7/1990 |
| JP | H8-36717 A | 2/1996 |
| JP | 2003-23286 A | 1/2003 |
| JP | 2005-514797 A | 5/2005 |
| JP | 2012-33764 A | 2/2012 |
| JP | 2012-38807 A | 2/2012 |
| JP | 2013-153041 A | 8/2013 |
| JP | 2013-207059 A | 10/2013 |
| JP | 2017-143210 A | 8/2017 |
| JP | 2018-195660 A | 12/2018 |
| JP | 2019-54059 A | 4/2019 |

\* cited by examiner

ELECTROMAGNETIC WAVE ATTENUATOR AND ELECTRONIC DEVICE

CROSS-REFERENCE TO RELATED APPLICATIONS

This application is based upon and claims the benefit of priority from Japanese Patent Application No. 2019-012148, filed on Jan. 28, 2019; the entire contents of which are incorporated herein by reference.

FIELD

Embodiments described herein relate generally to an electromagnetic wave attenuator and an electronic device.

BACKGROUND

For example, an electromagnetic wave attenuator such as an electromagnetic shield sheet or the like has been proposed. There is an electronic device that includes the electromagnetic wave attenuator and a semiconductor element. It is desirable to improve the attenuation characteristics for electromagnetic waves of the electromagnetic wave attenuator.

BRIEF DESCRIPTION OF THE DRAWINGS

FIG. 4A and FIG. 46 are schematic cross-sectional views illustrating the electromagnetic wave attenuator according to the first embodiment;

DETAILED DESCRIPTION

Figure 1A:
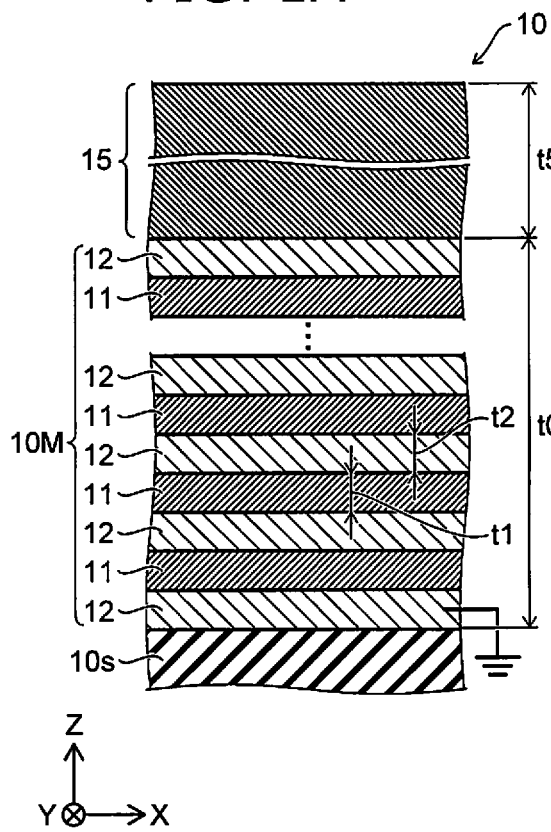
FIG. 1A to FIG. 1C are schematic views illustrating an electromagnetic wave attenuator according to a first embodiment.

According to one embodiment, an electromagnetic wave attenuator includes a multilayer member, and a magnetic member. The multilayer member includes a plurality of magnetic layers and a plurality of nonmagnetic layers. The plurality of nonmagnetic layers is conductive. A direction from one of the plurality of magnetic layers toward an other one of the plurality of magnetic layers is aligned with a first direction from the multilayer member toward the magnetic member. One of the plurality of nonmagnetic layers is between the one of the plurality of magnetic layers and the other one of the plurality of magnetic layers. A thickness along the first direction of the magnetic member is not less than ½ of a thickness along the first direction of the multilayer member.

According to one embodiment, an electronic device includes the electromagnetic wave attenuator described above, and an electronic element.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
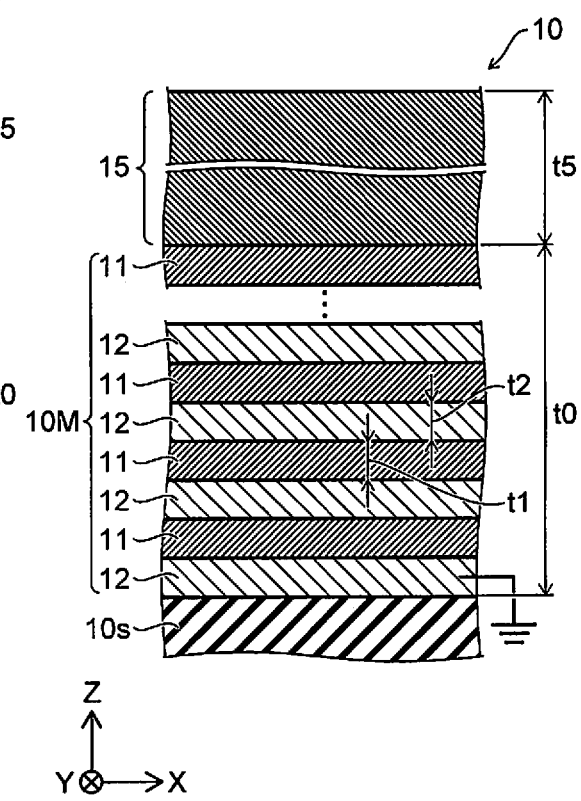
Figure 1C:
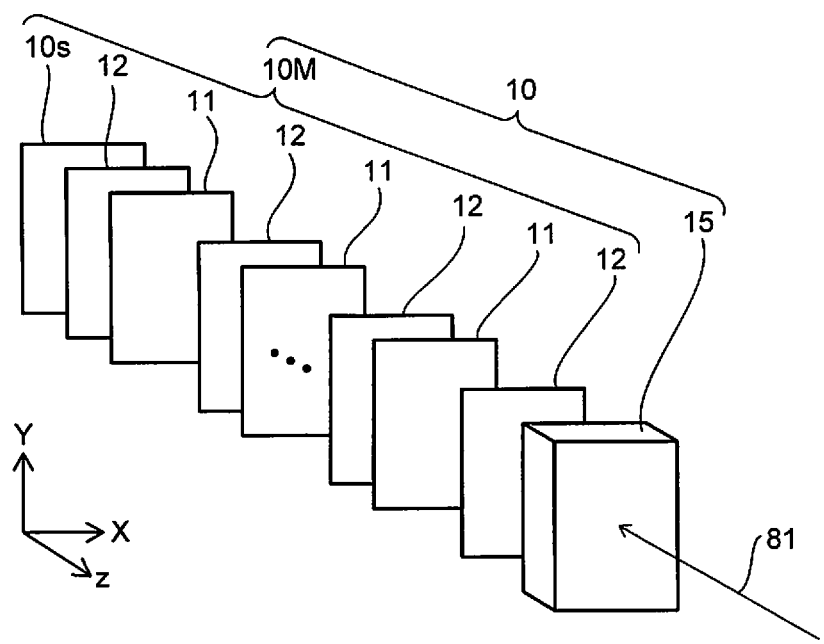

FIG. 1A to FIG. 1C are schematic views illustrating an electromagnetic wave attenuator according to a first embodiment.

In FIG. 1C, the positions of multiple layers are illustrated as being shifted for easier viewing of the drawing.

As shown in FIG. 1A to FIG. 1C, the electromagnetic wave attenuator 10 according to the embodiment includes a multilayer member 10M and a magnetic member 15.

The direction from the multilayer member 10M toward the magnetic member 15 is aligned with a first direction. The first direction is taken as a Z-axis direction. One direction perpendicular to the Z-axis direction is taken as an X-axis direction. A direction perpendicular to the Z-axis direction and the X-axis direction is taken as a Y-axis direction.

The multilayer member 10M includes multiple magnetic layers 11 and multiple conductive nonmagnetic layers 12. The direction from one of the multiple magnetic layers 11 toward an other one of the multiple magnetic layers 11 is aligned with the first direction (the Z-axis direction). One of the multiple nonmagnetic layers 12 is between the one of the multiple magnetic layers 11 recited above and the other one of the multiple magnetic layers 11 recited above.

For example, the multiple magnetic layers 11 and the multiple nonmagnetic layers 12 are provided alternately along the first direction. For example, the multiple magnetic layers 11 are arranged along the first direction. For example, the multiple nonmagnetic layers 12 are arranged along the first direction. One of the multiple magnetic layers 11 is between one of the multiple nonmagnetic layers 12 and an other one of the multiple nonmagnetic layers 12.

For example, at least a portion of the multiple magnetic layers 11 is parallel to the X-Y plane. For example, at least a portion of the multiple nonmagnetic layers 12 is parallel to the X-Y plane. For example, the magnetic member 15 is parallel to the X-Y plane.

As shown in FIG. 1A to FIG. 1C, the electromagnetic wave attenuator 10 may include a base body 10s. For example, the multiple magnetic layers 11 and the multiple nonmagnetic layers 12 are formed alternately on the base body 10s.

In one example according to the embodiment, the base body 10s is a mold resin, etc. In another example, the base body 10s may be a resin layer, etc. For example, the resin layer is provided on a plastic sheet. In the embodiment, the surface of the base body 10s may have an unevenness. In such a case, as described below, the multiple magnetic layers 11 and the multiple nonmagnetic layers 12 may have uneven configurations along the unevenness of the base body.

As shown in FIG. 1C, an electromagnetic wave 81 is incident on the electromagnetic wave attenuator 10 including the multilayer member 10M and the magnetic member 15. The electromagnetic wave 81 that is incident on the electromagnetic wave attenuator 10 is attenuated by the electromagnetic wave attenuator 10. For example, the electromagnetic wave attenuator 10 can be used as an electromagnetic wave shield body. For example, at least one of the multiple magnetic layers 11 and/or the multiple nonmagnetic layers 12 is grounded (referring to FIG. 1A).

As shown in FIG. 1A, for example, the magnetic member 15 contacts the multilayer member 10M. In the example of FIG. 1A, one (an other one) of the multiple nonmagnetic layers 12 contacts the magnetic member 15. In the example shown in FIG. 1B, one of the multiple magnetic layers 11 contacts the magnetic member 15. The boundary between the magnetic member 15 and the one of the multiple magnetic layers 11 may be indistinct. In such a case, the magnetic layer 11 that contacts the magnetic member 15 may be considered to be included in the magnetic member 15.

The thickness along the first direction of one of the multiple magnetic layers 11 is taken as a thickness t1. The thickness t1 is, for example, not less than 20 nm and not more than 500 nm.

The thickness along the first direction of one of the multiple nonmagnetic layers 12 is taken as a thickness t2. The thickness t2 is, for example, not less than 2 nm and not more than 500 nm.

The thickness along the first direction of the magnetic member 15 is taken as a thickness t5. The thickness t5 is thicker than the thickness t1. The thickness t5 is thicker than the thickness t2. The thickness t5 is, for example, 1 μm or more. The thickness t5 may be, for example, 1 μm or more. The thickness t5 may be, for example, 4 μm or more. The thickness t5 is, for example, not less than 5 times the thickness t1.

In the embodiment, for example, the thick magnetic member 15 is stacked on the multilayer member 10M which includes the thin magnetic layers and the thin nonmagnetic layers stacked alternately. For example, the thickness t5 along the first direction of the magnetic member 15 is not less than ½ of a thickness t0 along the first direction of the multilayer member 10M.

By such a configuration, it was found that attenuation characteristics exceed the level that is expected by adding the attenuation characteristics of the multilayer member 10M to that of the magnetic member 15.

Experimental results obtained by the inventor of the application will now be described. Samples SP01, SP02, SP03, SP04, and SP05 are fabricated in the experiment.

In the sample SP01, multiple sets of the magnetic layer 11 and the nonmagnetic layer 12 are provided. In one set, the magnetic layer 11 is a NiFeCuMo layer having a thickness (a first thickness t1) of 100 nm and the nonmagnetic layer 12 is a Cu layer having a thickness (a second thickness t2) of 100 nm. A number Ns of sets, that include one magnetic layer 11 and one nonmagnetic layer 12, is 10. The sample SP01 corresponds to the multilayer member 10M.

In the sample SP02, multiple sets of the magnetic layer 11 and the nonmagnetic layer 12 are provided. In one set, the magnetic layer 11 is a NiFeCuMo layer having a thickness (the first thickness t1) of 50 nm and the nonmagnetic layer 12 is a Ta layer having a thickness (the second thickness t2) of 5 nm. The number Ns of sets, that include one magnetic layer 11 and one nonmagnetic layer 12, is 37. The sample SP02 corresponds to the multilayer member 10M.

In the sample SP03, a NiFeCuMo layer having a thickness of 2 μm is provided. In the sample SP03, only the magnetic layer is provided. SP03 does not include a nonmagnetic layer. The sample SP03 corresponds to the magnetic member 15.

In the sample SP04, a magnetic member 15 (the NiFeCuMo layer having the thickness of 2 μm) that has the same configuration as the sample SP03 is further provided on the multilayer member 10M that has the same configuration as the sample SP01 recited above. The nonmagnetic layer 12 (the Cu layer having the thickness of 100 nm) that is included in the sample SP01 contacts the NiFeCuMo layer of the magnetic member 15.

In the sample SP05, the magnetic member 15 (the NiFeCuMo layer having the thickness of 2 μm) that has the same configuration as the sample SP03 is further provided on the multilayer member 10M that has the same configuration as the sample SP02 recited above. The nonmagnetic layer 12 (the Ta layer having the thickness of 5 nm) that is included in the sample SP02 contacts the NiFeCuMo layer of the magnetic member 15.

An electromagnetic wave 81 is incident on the samples and the amplitude of the transmitted electromagnetic wave 81 through these samples is measured.

Figure 2:
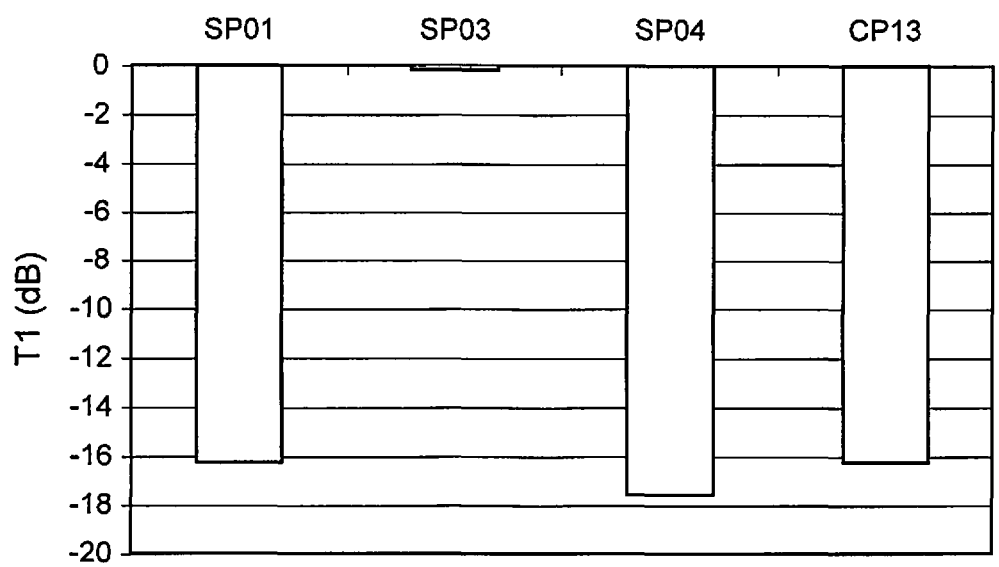
FIG. 2 is a graph illustrating characteristics of the electromagnetic wave attenuator.
Figure 3:
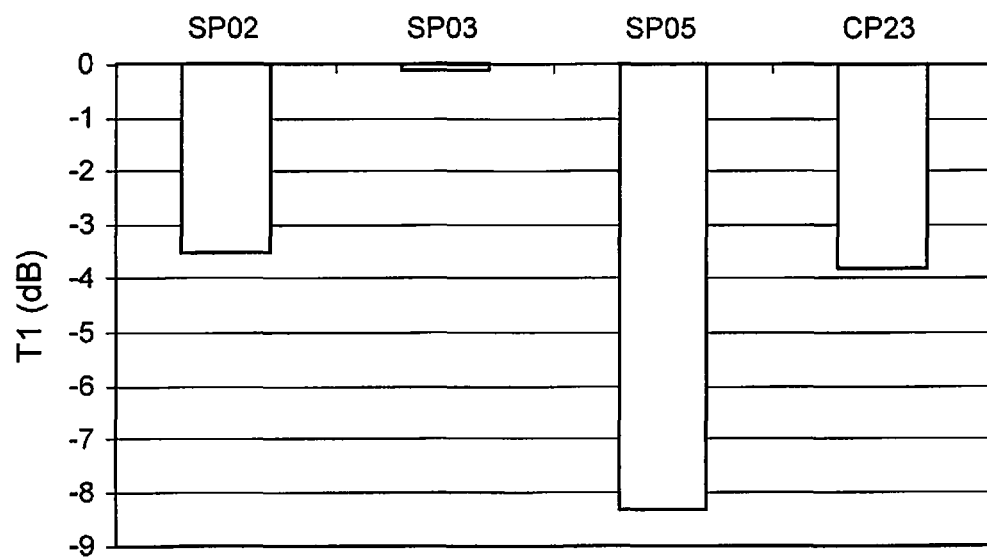
FIG. 3 is a graph illustrating characteristics of the electromagnetic wave attenuator.

FIG. 2 and FIG. 3 are graphs illustrating characteristics of the electromagnetic wave attenuator.

In these figures, the vertical axis is a transmission characteristic T1 (dB) of the incident electromagnetic wave 81 with the frequency of 100 MHz. A low transmission characteristic T1 (the absolute value being large) corresponds to a large amount of the attenuation of the electromagnetic wave 81 incident on the electromagnetic wave attenuator. It is desirable for the transmission characteristic T1 to be low (for the absolute value to be large).

As shown in FIG. 2, for the sample SP01 corresponding to the multilayer member 10M, the transmission characteristic T1 is −16.2 dB. For the sample SP03 corresponding to the magnetic member 15, the transmission characteristic T1 is −0.1 dB. For the sample SP04 including the multilayer member 10M and the magnetic member 15, the transmission characteristic T1 is −17.6 dB.

In FIG. 2, a calculation result CP13 that is derived by simply summing the transmission characteristic T1 of the sample SP01 and the transmission characteristic T1 of the sample SP03 is also shown. In the calculation, the interaction between the multilayer member 10M and the magnetic member 15, etc., are not considered. For the calculation result CP13, the transmission characteristic T1 is −16.2 dB.

As described above, the transmission characteristic T1 for the sample SP04 is −17.6 dB and is clearly lower (has a larger absolute value) than the expected value (calculation result CP13) of −16.2 dB.

As shown in FIG. 3, for the sample SP02 corresponding to the multilayer member 10M, the transmission characteristic T1 is −3.5 dB. As described above, for the sample SP03 corresponding to the magnetic member 15, the transmission characteristic T1 is −0.1 dB. For the sample SP05 including the multilayer member 10M and the magnetic member 15, the transmission characteristic T1 is −8.3 dB.

In FIG. 3, a calculation result CP23 that is derived by simply summing the transmission characteristic T1 of the sample SP02 and the transmission characteristic T1 of the sample SP03 is also shown. In the calculation, the interaction between the multilayer member 10M and the magnetic member 15, etc., are not considered. For the calculation result CP23, the transmission characteristic T1 is −3.8 dB.

As described above, the transmission characteristic T1 for the sample SP05 is −8.3 dB and is clearly lower (has a larger absolute value) than the expected value (calculation result CP23) of −3.8 dB.

In the embodiment, the configurations of the samples SP04, SP05, etc., are employed. A low transmission characteristic T1 (having a large absolute value) is obtained thereby. According to the embodiment, an electromagnetic wave attenuator can be provided in which the attenuation characteristics for electromagnetic waves can be improved.

From the results shown in FIG. 2 and FIG. 3, an interaction between the magnetic member 15 and the multilayer member 10M may some effect on the improvement of the attenuation characteristics.

Figure 4A:
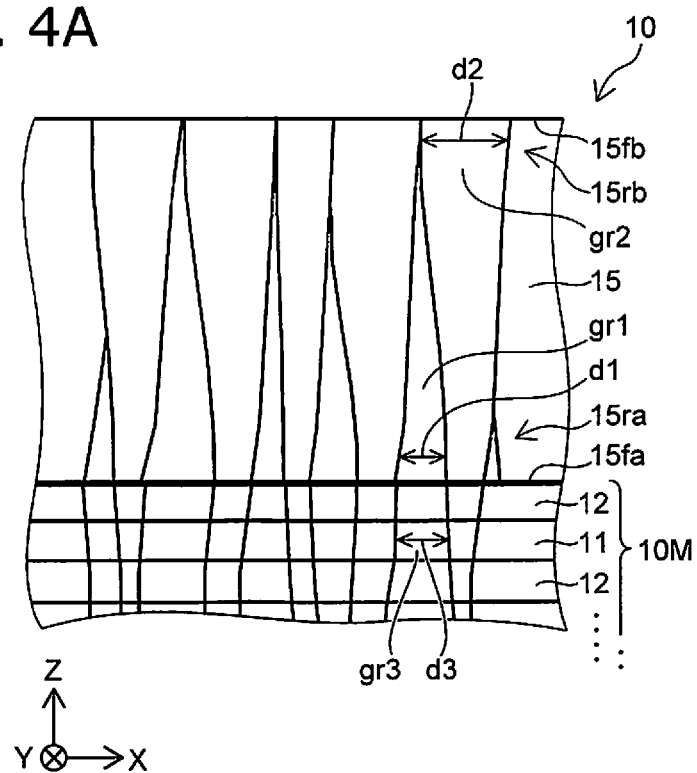
Figure 4B:
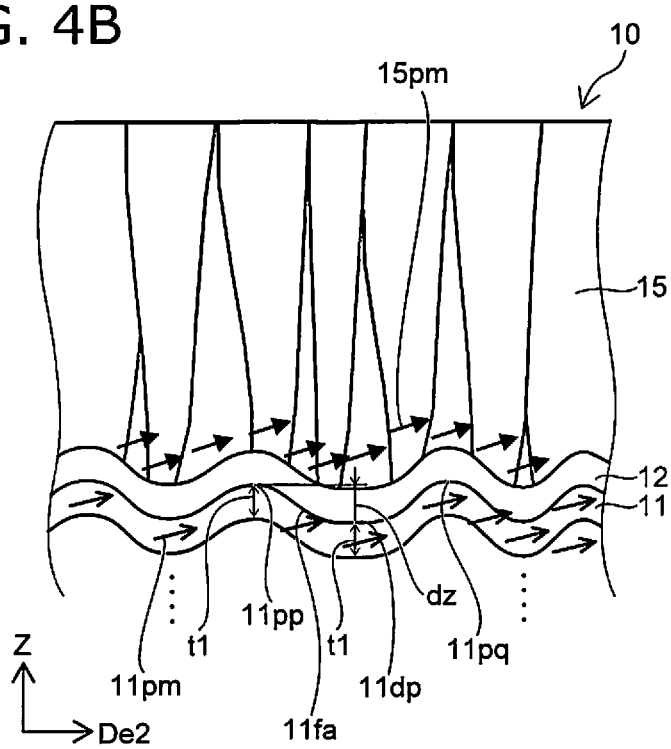

FIG. 4A and FIG. 4B are schematic cross-sectional views illustrating the electromagnetic wave attenuator according to the first embodiment.

As shown in FIG. 4A, the thick magnetic member 15 is provided on the multilayer member 10M including the thin magnetic layers 11 and the thin nonmagnetic layers 12. One of the multiple magnetic layers 11 includes third crystal grains gr3. Because the magnetic layer 11 is thin, a size d3 (e.g., the grain size) of the third crystal grain gr3 is relatively small. The size is the length along the X-Y plane. For example, the average value of the sizes d3 of the third crystal grains gr3 is 40 nm or less.

The magnetic member 15 is provided on such a multilayer member 10M with the third crystal grains gr3. Because the magnetic member 15 is thick, the sizes of the crystal grains in the magnetic member 15 increase with the thickness during the film deposition process of the magnetic member 15.

For example, the magnetic member 15 includes a first member region 15ra and a second member region 15rb. The first member region 15ra is between the second member region 15rb and the multilayer member 10M in the first direction (the Z-axis direction). The first member region 15ra is a region (a bottom region) on the multilayer member 10M side. The second member region 15rb is a region (an upper region) on the opposite side.

The first member region 15ra includes multiple first crystal grains gr1. The second member region 15rb includes multiple second crystal grains gr2. The average value of sizes d1 of the multiple first crystal grains gr1 is less than the average value of sizes d2 of the multiple second crystal grains gr2.

For example, the magnetic member 15 has a first member surface 15fa and a second member surface 15fb. The first member surface 15fa is between the second member surface 15fb and the multilayer member 10M in the first direction (the Z-axis direction). The first member surface 15fa includes the multiple first crystal grains gr1. The second member surface 15fb includes the multiple second crystal grains gr2. The average value of the sizes d1 of the multiple first crystal grains gr1 is less than the average value of the sizes d2 of the multiple second crystal grains gr2.

Since the magnetic member 15 is deposited on the multilayer member 10M including the thin magnetic layers 11, the size d3 of the third crystal grain gr3 included in the magnetic member 15 becomes small at the vicinity of the multilayer member 10M (e.g., at the first member region 15ra).

When the size d3 of the third crystal grain gr3 is small at the vicinity of the multilayer member 10M, the inter-layer magnetostatic interaction between the magnetic layer 11 and the third crystal grains gr3 seems to be large.

Generally, an exchange coupling interaction align the orientations of the spins inside a ferromagnetic material to some direction. In the magnetic material with a polycrystalline microstructure, the exchange coupling interaction becomes small or zero at the crystal grain boundary. Accordingly, the spins in a crystal grain precess in unison as substantially one spin unit when an alternating-current magnetic field is applied to the magnetic material with a polycrystalline microstructure. When the size of the crystal grain of the magnetic member 15 is small at the vicinity of the multilayer member 10M, the precession unit becomes small and responses the local magnetic field well. Then, for example, the magnetostatic interaction, etc., becomes stronger. Thereby, for example, the attenuation characteristics for electromagnetic waves may improve.

As shown in FIG. 4B, in the case where the magnetic layer 11 has a feature of an unevenness, for example, the magnetostatic interaction between the protrusion of the magnetic layer 11 and the third crystal grain gr3 may be large.

For example, one of the multiple magnetic layers 11 has a first magnetic layer surface 11fa opposing one of the multiple nonmagnetic layers 12. The first magnetic layer surface 11fa includes a first top portion 11pp and a first bottom portion 11dp. A distance dz along the first direction (the Z-axis direction) between the first top portion 11pp and the first bottom portion 11dp is 10 nm or more. The distance dz corresponds to the height (the depth) of the unevenness. The distance dz may be 50 nm or more.

For example, the first magnetic layer surface 11fa includes the first top portion 11pp, a second top portion 11pq, and the first bottom portion 11dp. The position of the first bottom portion 11dp in a second direction De2 crossing the first direction (the Z-axis direction) is between the position of the first top portion 11pp in the second direction De2 and the position of the second top portion 11pq in the second direction De2. At least a portion of one of the multiple nonmagnetic layers 12 is between the first top portion 11pp and the second top portion 11pq in the second direction De2.

Because the magnetic layer 11 has such an unevenness, for example, a large magnetostatic interaction may be generated between a magnetization 11pm of the protrusion (the portion including the first top portion 11pp) and a magnetization 15pm of the magnetic member 15.

Because the size d1 of the crystal grain (e.g., the first crystal grain gr1) of the magnetic member 15 is small, the magnetostatic interaction between the magnetization 11pm and the magnetization 15pm may become larger.

Since such an large magnetostatic interaction occurs between the multilayer member 10M and the magnetic member 15, the low transmission characteristic T1 (having the large absolute value) is obtained for the sample SP04 and the sample SP05, as described in reference to FIG. 2 and FIG. 3.

Figure 5A:
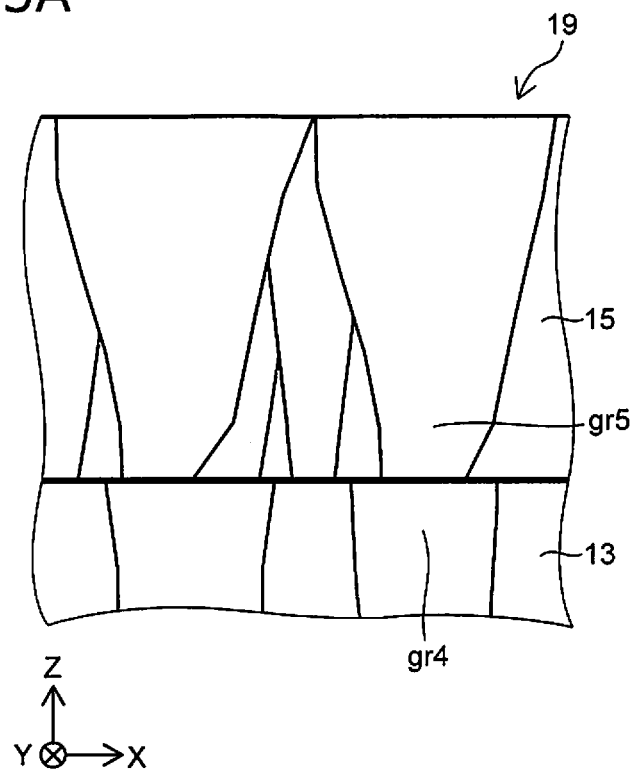
FIG. 5A and FIG. 5B are schematic cross-sectional views illustrating an electromagnetic wave attenuator of a reference example.
Figure 5B:
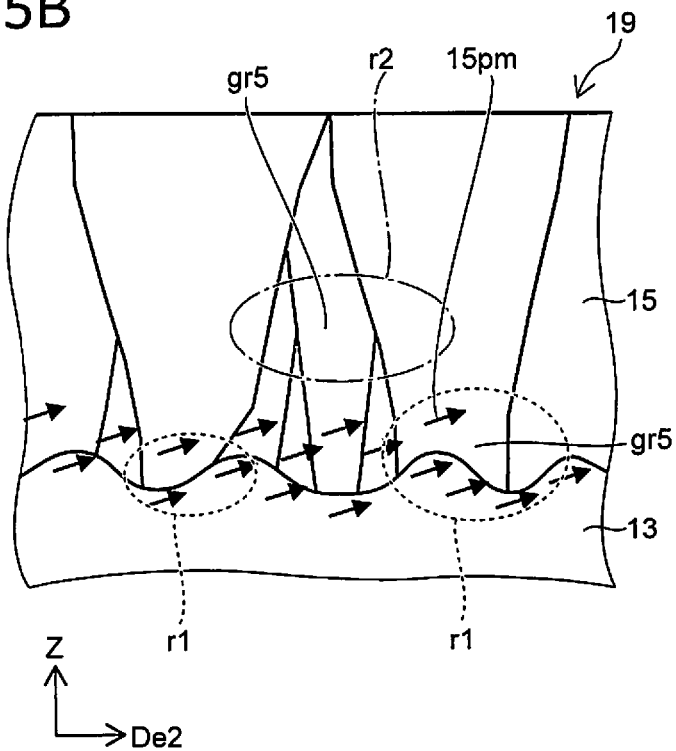

FIG. 5A and FIG. 5B are schematic cross-sectional views illustrating an electromagnetic wave attenuator of a reference example. In the reference example of the electromagnetic wave attenuator 19 shown in FIG. 5A, the magnetic member 15 is provided on a nonmagnetic layer 13. The nonmagnetic layer 13 is, for example, a thick Cu layer. The nonmagnetic layer 13 is an ordinal under layer. As shown in FIG. 5A, a crystal grain gr4 of the nonmagnetic layer 13 is large. Therefore, a crystal grain gr5 of the magnetic member 15 is also relatively large. Because the crystal grains in the magnetic member 15 are large, the improvement of the attenuation characteristics of the electromagnetic wave 81 may be insufficient.

As shown in FIG. 5B, in the case where the nonmagnetic layer 13 has an unevenness, a magnetostatic interaction may be large in a region r1 of the magnetic member 15 at the vicinity of the nonmagnetic layer 13. However, since the crystal grain gr5 is large, the local magnetostatic interaction may be averaged over and total amount of the magnetostatic interaction may become small. In a region r2 distal to the nonmagnetic layer 13, the magnetostatic interaction substantially disappears. Therefore, the improvement of the attenuation characteristics for electromagnetic waves may be insufficient.

The unique characteristics that are obtained when combining the multilayer member 10M and the magnetic member 15 (referring to FIG. 2 and FIG. 3) are conventionally-unknown. For example, such characteristics seems to be obtained by the effects described in reference to FIG. 5A and FIG. 5B.

In the embodiment, it is favorable for the thickness t1 of the magnetic layer 11 to be sufficiently thin compared to the thickness t5 of the magnetic member 15. For example, the thickness t1 along the first direction of one of the multiple magnetic layers 11 is not more than ⅕ of the thickness t5 along the first direction of the magnetic member 15.

In the embodiment, it is favorable for the thickness t2 of the nonmagnetic layer 12 to be sufficiently thin compared to the thickness t5 of the magnetic member 15. For example, the thickness t2 along the first direction of one of the multiple nonmagnetic layers 12 is not more than ⅕ of the thickness t5 along the first direction of the magnetic member 15.

Figure 6:
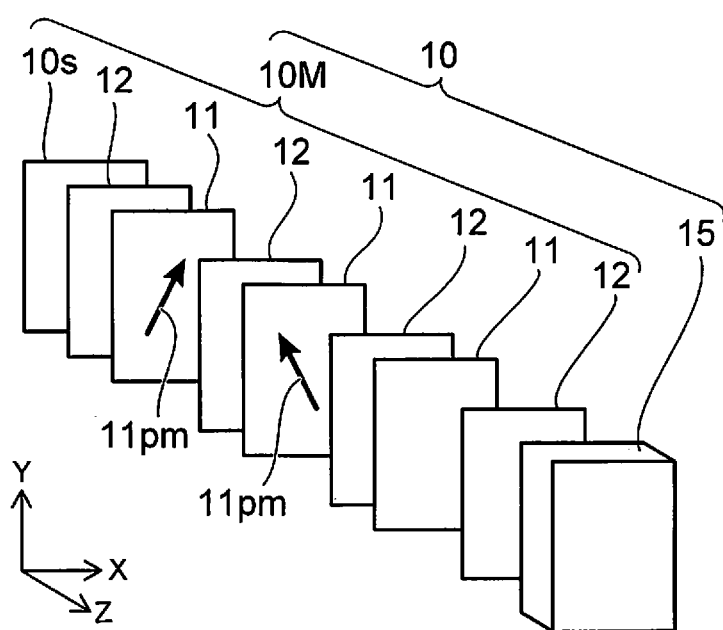
FIG. 6 is a schematic plan view illustrating the electromagnetic wave attenuator according to the first embodiment.

FIG. 6 is a schematic plan view illustrating the electromagnetic wave attenuator according to the first embodiment.

In FIG. 6, the positions of the multiple layers are illustrated as being shifted for easier viewing of the drawing. As shown in FIG. 6, at least a portion of each of the multiple magnetic layers 11 includes the direction of the magnetization 11pm (the magnetization easy axis). The orientation of the magnetization of at least a portion of one of the multiple magnetic layers 11 may cross the orientation of the magnetization of at least a portion of another one of the multiple magnetic layers 11. Electromagnetic waves that have multiple vibration planes can be attenuated effectively thereby.

For example, some magnetic layers 11 may be deposited under a magnetic field. The multilayer member 10M with multiple magnetization easy axes as shown in FIG. 6 can be obtained by changing the direction of the magnetic field at deposition process from one magnetic layer 11 to another magnetic layer 11.

In the embodiment, the direction of the magnetizations such as those illustrated in FIG. 6 can be observed using, for example, a polarizing microscope, etc.

Figure 7:
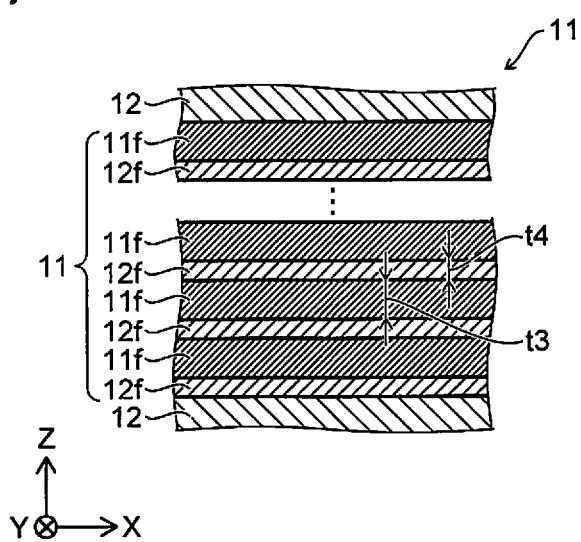
FIG. 7 is a schematic cross-sectional view illustrating an electromagnetic wave attenuator according to the first embodiment.

FIG. 7 is a schematic cross-sectional view illustrating an electromagnetic wave attenuator according to the first embodiment.

FIG. 7 illustrates one of the multiple magnetic layers 11. As shown in FIG. 7, at least one of the multiple magnetic layers 11 may include multiple magnetic films 11f and multiple nonmagnetic films 12f. The multiple magnetic films 11f and the multiple nonmagnetic films 12f are provided alternately along the first direction (the Z-axis direction). For example, the multiple nonmagnetic films 12f may be insulative or conductive. For example, the orientation from one of the multiple magnetic films 11f toward another one of the multiple magnetic films 11f is aligned with the first direction (the Z-axis direction). One of the multiple nonmagnetic films 12f is between one of the multiple magnetic films 11f and another one of the multiple magnetic films 11f. For example, the multiple magnetic films 11f are arranged along the first direction. For example, the multiple nonmagnetic films 12f are arranged along the first direction.

A thickness t3 along the first direction of one of the multiple magnetic films 11f is thicker than a thickness t4 along the first direction of one of the multiple nonmagnetic films 12f. The thickness t4 is, for example, not less than 0.5 nm and not more than 7 nm.

For example, the multiple nonmagnetic films 12f function as under layers. By forming one of the multiple magnetic films 11f on one of the multiple nonmagnetic films 12f, for example, good soft magnetic properties are obtained in the one of the multiple magnetic films 11f. For example, an appropriate magnetic domain or an appropriate domain wall region is formed in the multiple magnetic films 11f. For example, a high attenuation effect is obtained.

At least a portion of at least one of the multiple magnetic films 11f includes at least one selected from the group consisting of Co, Ni, and Fe. For example, one of the multiple magnetic films 11f is a soft magnetic film.

At least a portion of at least one of the multiple nonmagnetic films 12f includes at least one selected from the group consisting of Cu, Ta, Ti, W, Mo, Nb, and Hf. At least one of the multiple nonmagnetic films 12f is, for example, a Cu film.

At least a portion of at least one of the multiple magnetic layers 11 includes at least one selected from the group consisting of Co, Ni, and Fe. One of the multiple magnetic layers 11 is, for example, a soft magnetic layer. At least a portion of at least one of the multiple magnetic layers 11 may further include at least one selected from the group consisting of Cu and Mo.

At least a portion of at least one of the multiple magnetic layers 11 may include $Fe_{100-x1-x2}\alpha_1 N_{x2}$. $\alpha$ includes, for example, at least one selected from the group consisting of Zr, Hf, Ta, Nb, Ti, Si, and Al. The composition ratio x1 is, for example, not less than 0.5 atomic percent and not more than 10 atomic percent. The composition ratio x2 is, for example, not less than 0.5 atomic percent and not more than 8 atomic percent.

At least a portion of at least one of the multiple magnetic layers 11 may include, for example, NiFe, CoFe, FeSi, FeZrN, FeCo, etc. At least a portion of at least one of the multiple magnetic layers 11 may include, for example, an amorphous alloy.

At least a portion of at least one of the multiple nonmagnetic layers 12 may include at least one selected from the group consisting of Cu, Al, Ni, Cr, Mn, Mo, Zr, and Si.

Second Embodiment

FIG. 8A to FIG. 8D are schematic views illustrating an electronic device according to a second embodiment.

Figure 8A:
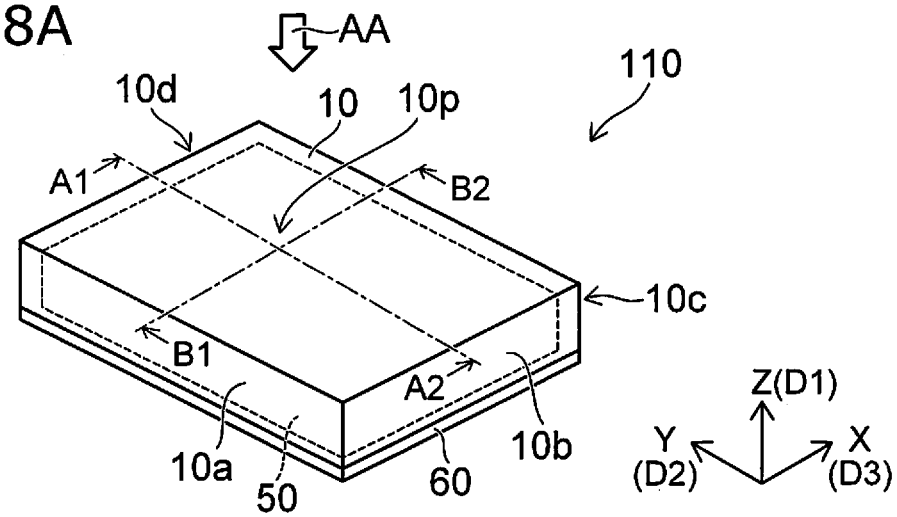
FIG. 8A to FIG. 8D are schematic views illustrating an electronic device according to a second embodiment.
Figure 8B:
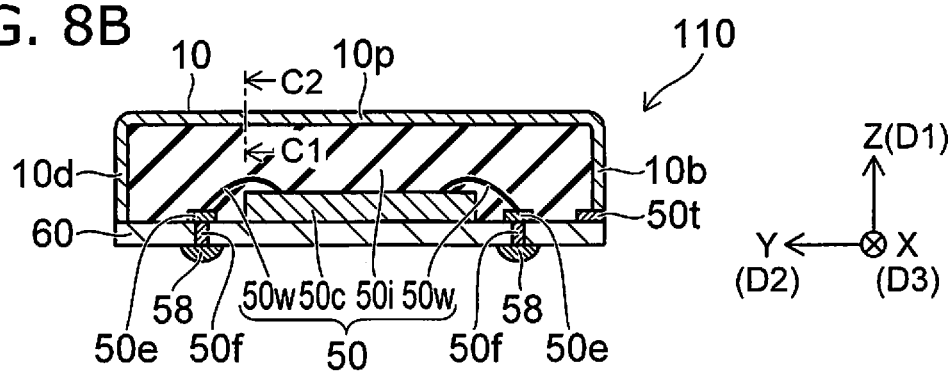
Figure 8C:
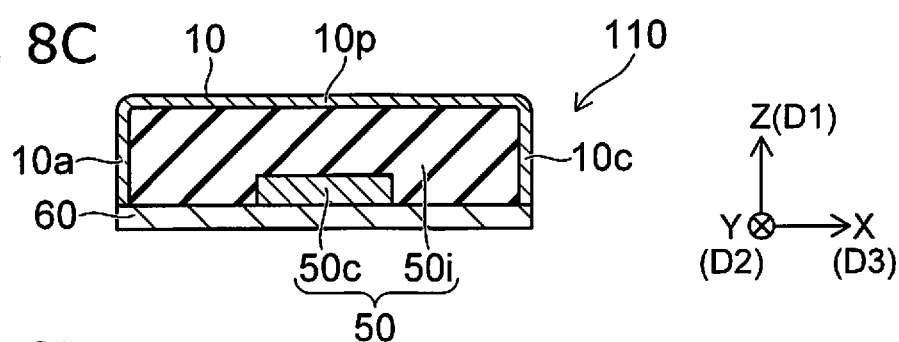
Figure 8D:
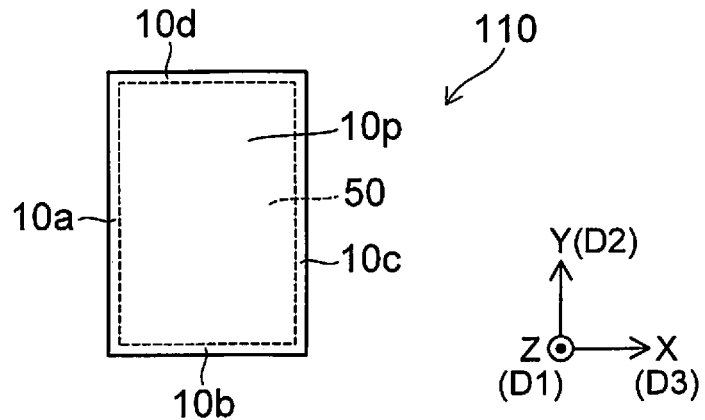

FIG. 8A is a perspective view. FIG. 8B is a line A1-A2 cross-sectional view of FIG. 8A. FIG. 8C is a line B1-B2 cross-sectional view of FIG. 8A. FIG. 8D is a plan view as viewed along arrow AA of FIG. 8A. FIG. 1A or FIG. 1B corresponds to a line C1-C2 cross section of FIG. 8B.

As shown in FIG. 8A, the electronic device 110 according to the second embodiment includes an electronic element 50 and the electromagnetic wave attenuator 10. A substrate 60 is further provided in the example. The electromagnetic wave attenuator 10 covers at least a portion of the electronic element 50. The electronic element 50 is, for example, a semiconductor element.

In the example as shown in FIG. 8B, the electronic element 50 includes a semiconductor chip 50c, an insulating portion 50i, and a wire 50w. In the example, an electrode 50e, a substrate connector 50f, and a connector 58 are provided at the substrate 60. The wire 50w electrically connects the electrode 50e and a portion of the semiconductor chip 50c. The electrode 50e and the connector 58 are electrically connected by the substrate connector 50f. The substrate connector 50f pierces the substrate 60. The connector 58 functions as an input/output portion of the semiconductor chip 50c. The connector 58 may be, for example, a terminal. The insulating portion 50i is provided around the semiconductor chip 50c. The insulating portion 50i includes, for example, at least one of a resin, a ceramic, etc. The semiconductor chip 50c is protected by the insulating portion 50i.

The electronic element 50 includes, for example, at least one of an arithmetic circuit, a control circuit, a memory circuit, a switching circuit, a signal processing circuit, or a high frequency circuit.

The base body 10s of the electromagnetic wave attenuator 10 (referring to FIG. 1A) may be, for example, the electronic element 50. The base body 10s of the electromagnetic wave attenuator 10 may be, for example, the insulating portion 50i.

In the example as illustrated in FIG. 8B, the electromagnetic wave attenuator 10 is electrically connected to a terminal 50t provided at the substrate 60. The electromagnetic wave attenuator 10 is set to a constant potential (e.g., the ground potential) via the terminal 50t. For example, the electromagnetic wave attenuator 10 attenuates the electromagnetic waves radiated from the electronic element 50. For example, the electromagnetic wave attenuator 10 functions as a shield.

As shown in FIG. 8A to FIG. 8C, the electromagnetic wave attenuator 10 includes a planar portion 10p and first to fourth side surface portions 10a to 10d. The direction from the electronic element 50 toward the planar portion 10p of the electromagnetic wave attenuator 10 is aligned with a first direction D1 (e.g., the Z-axis direction).

As shown in FIG. 8B and FIG. 8C, the electronic element 50 is positioned between the planar portion 10p and the substrate 60 in the first direction D1.

As shown in FIG. 8C and FIG. 8D, the electronic element 50 is positioned between the first side surface portion 10a and the third side surface portion 10c in the X-axis direction.

As shown in FIG. 8B and FIG. 8D, the electronic element 50 is positioned between the second side surface portion 10b and the fourth side surface portion 10d in the Y-axis direction.

By using the electromagnetic wave attenuator 10 described in reference to the first embodiment, for example, electromagnetic waves in the frequency range around 200 MHz or less can be attenuated effectively. An electronic device with improved attenuation characteristics for electromagnetic waves can be provided.

For example, the emission of the electromagnetic waves generated by the electronic element 50 can be suppressed. The electromagnetic waves from the outside to the electronic element 50 can be suppressed. Stable operations are obtained easily in the electronic element 50.

The planar portion 10p may be, for example, substantially a quadrilateral (including a parallelogram, a rectangle, or a square).

FIG. 9A to FIG. 9D are schematic cross-sectional views illustrating portions of the electronic device according to the second embodiment.

Figure 9A:
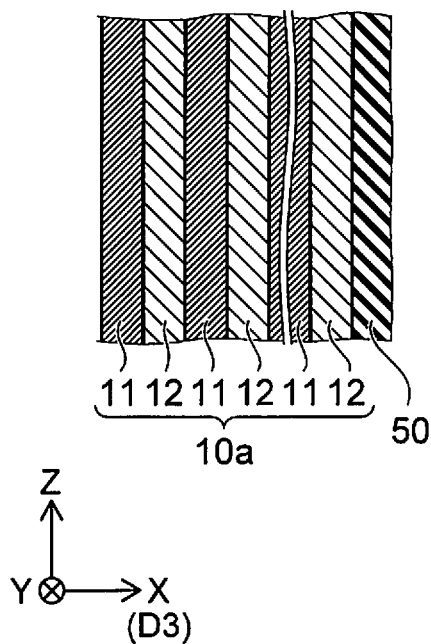
FIG. 9A to FIG. 9D are schematic cross-sectional views illustrating portions of the electronic device according to the second embodiment.

As shown in FIG. 9A, the first side surface portion 10a of the electromagnetic wave attenuator 10 includes the multiple magnetic layers 11 and the multiple nonmagnetic layers 12. The stacking direction of the multiple magnetic layers 11 and the multiple nonmagnetic layers 12 in the first side surface portion 10a is a third direction D3.

Figure 9B:
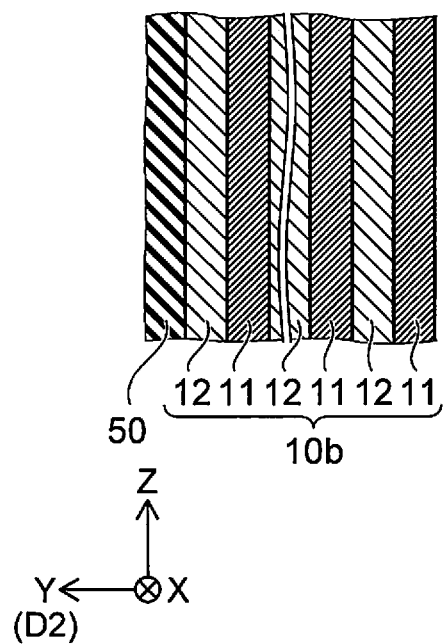

As shown in FIG. 9B, the second side surface portion 10b of the electromagnetic wave attenuator 10 includes the multiple magnetic layers 11 and the multiple nonmagnetic layers 12. The stacking direction of the multiple magnetic layers 11 and the multiple nonmagnetic layers 12 in the second side surface portion 10b is a second direction D2.

Figure 9C:
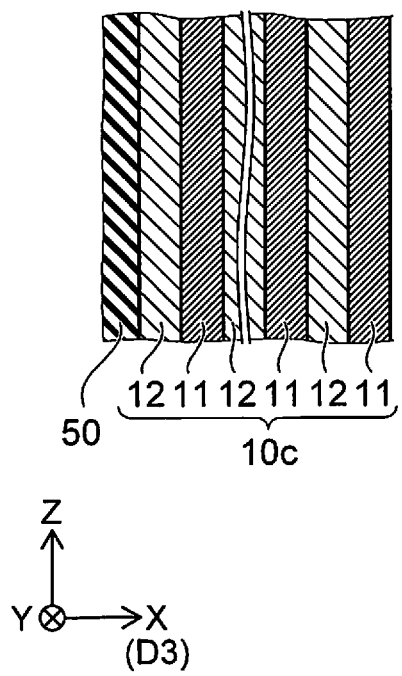

As shown in FIG. 9C, the third side surface portion 10c of the electromagnetic wave attenuator 10 includes the multiple magnetic layers 11 and the multiple nonmagnetic layers 12. The stacking direction of the multiple magnetic layers 11 and the multiple nonmagnetic layers 12 in the third side surface portion 10c is the third direction D3.

Figure 9D:
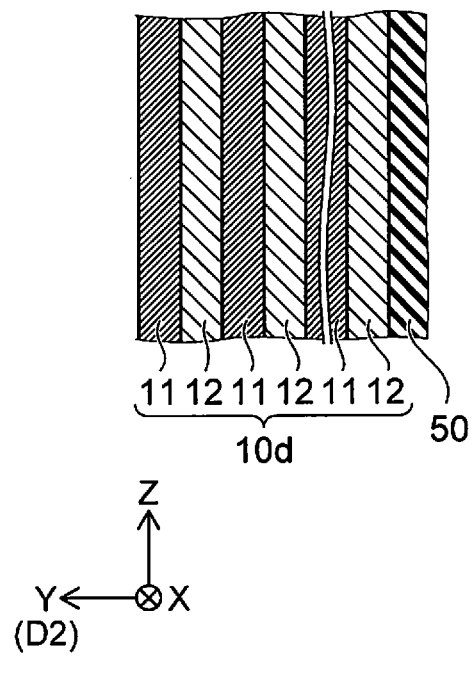

As shown in FIG. 9D, the fourth side surface portion 10d of the electromagnetic wave attenuator 10 includes the multiple magnetic layers 11 and the multiple nonmagnetic layers 12. The stacking direction of the multiple magnetic layers 11 and the multiple nonmagnetic layers 12 in the fourth side surface portion 10d is the second direction D2.

The magnetic layers 11 that are included in the first to fourth side surface portions 10a to 10d each may be continuous with the magnetic layer 11 included in the planar portion 10p. The nonmagnetic layers 12 that are included in the first to fourth side surface portions 10a to 10d each may be continuous with the nonmagnetic layer 12 included in the planar portion 10p.

Thus, the electronic device 110 according to the embodiment includes the electronic element 50 and the electromagnetic wave attenuator 10 according to the first embodiment. For example, the direction from the electronic element 50 toward the electromagnetic wave attenuator 10 is the first direction (the Z-axis direction).

For example, the electromagnetic wave attenuator 10 includes multiple regions (or multiple portions). At least a portion of the electronic element 50 is provided between the multiple regions. Multiple electromagnetic wave attenuators 10 may be provided. For example, the multiple electromagnetic wave attenuators 10 corresponds to the planar portion 10p and the first to fourth side surface portions 10a to 10d. For example, at least a portion of the electronic element 50 may be provided between the multiple electromagnetic wave attenuators 10.

FIG. 10 to FIG. 15 are schematic cross-sectional views illustrating electronic devices according to the second embodiment.

Figure 10:
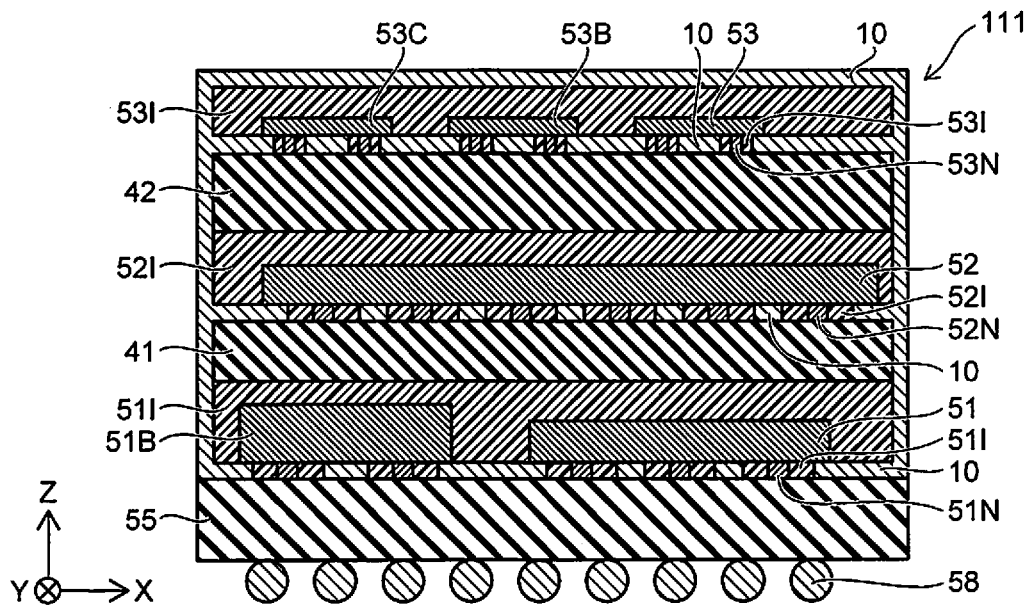
FIG. 10 is a schematic cross-sectional view illustrating electronic devices according to the second embodiment.

As shown in FIG. 10, an electronic device 111 according to the embodiment includes the electromagnetic wave attenuator 10 and multiple electronic elements (electronic elements 51, 51B, 52, 53, 53B, 53C, etc.).

The electronic elements are provided between multiple regions of the electromagnetic wave attenuator 10. An insulating region (insulating portions 41 and 42, etc.) may be provided between the electronic element and one of the multiple regions of the electromagnetic wave attenuator 10. A resin portion (resin portions 511, 521, 531, etc.) may be provided between the electronic element and the insulating region (the insulating portions 41 and 42, etc.). A connection member (connection members 51N, 52N, 53N, etc.) may be provided for each of the multiple electronic elements. For example, the electronic element and the connector 58 may be electrically connected by the connection member.

Figure 11:
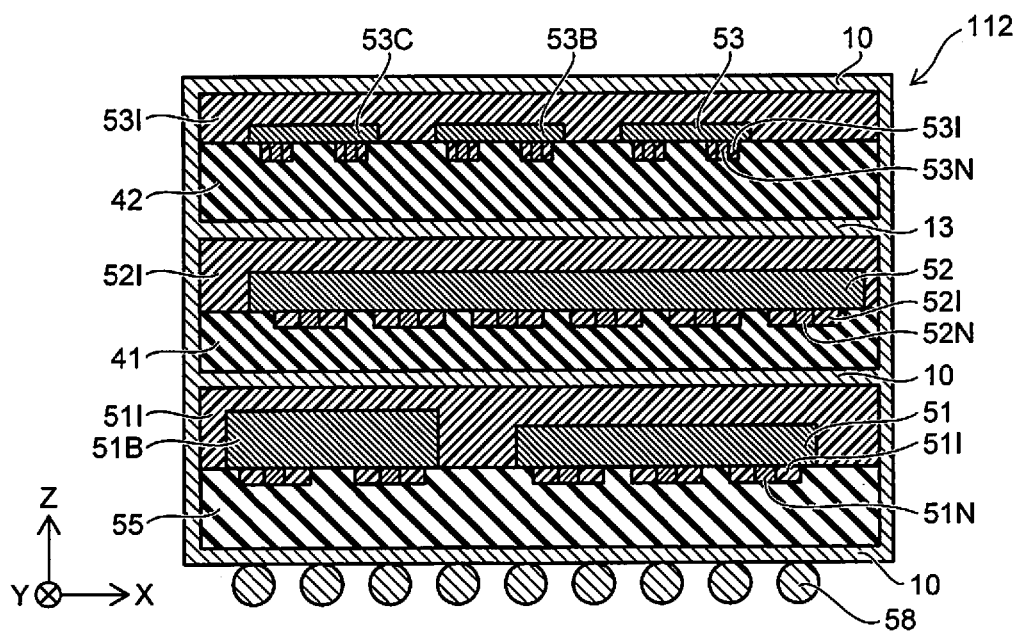
FIG. 11 is a schematic cross-sectional view illustrating electronic devices according to the second embodiment.

As in an electronic device 112 shown in FIG. 11, the connection member 51N may be sunk into a substrate 55.

Figure 12:
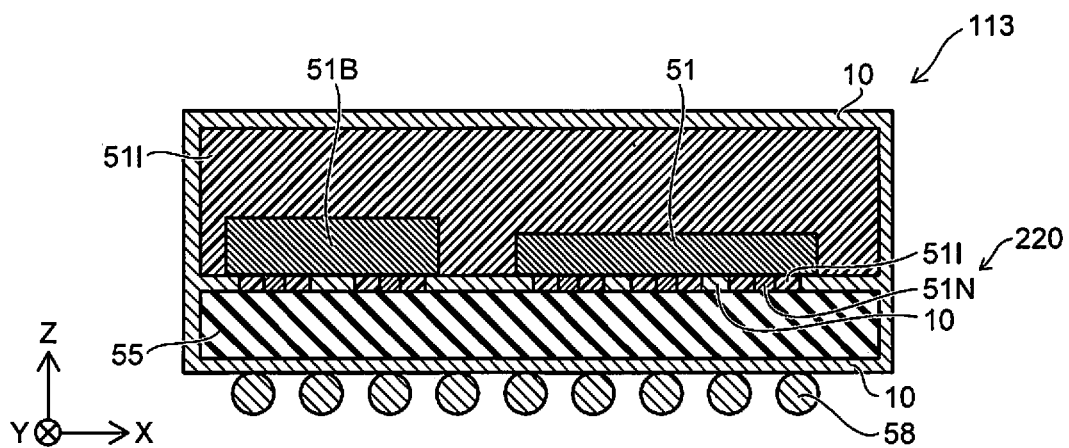
FIG. 12 is a schematic cross-sectional view illustrating electronic devices according to the second embodiment.

As in an electronic device 113 shown in FIG. 12, a mounting member 220 may be provided. The mounting member 220 includes the substrate 55 and the electromagnetic wave attenuator 10. Electronic elements (the electronic elements 51 and 51B) are provided between the mounting member 220 and another electromagnetic wave attenuator 10.

Figure 13:
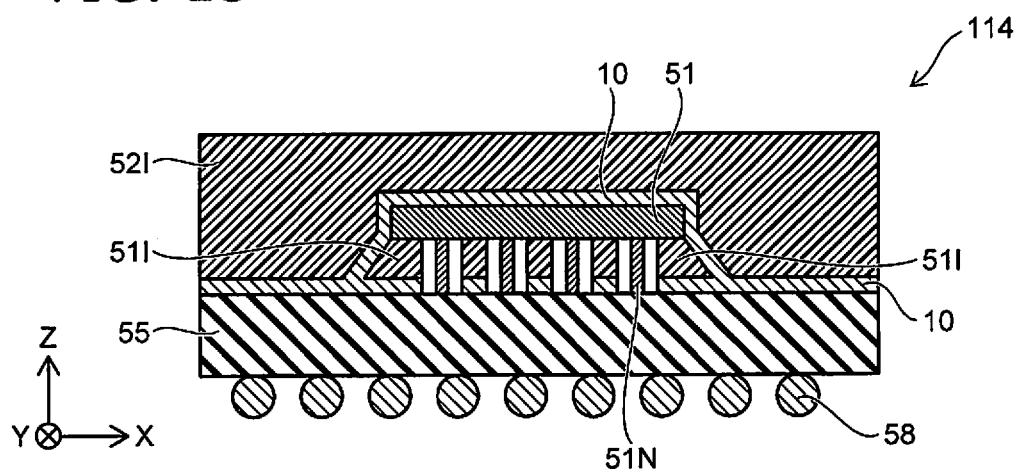
FIG. 13 is a schematic cross-sectional view illustrating electronic devices according to the second embodiment.

As in an electronic device 114 shown in FIG. 13, the electromagnetic wave attenuator 10 may be provided at the side surface of the electronic element 51. The side surface crosses the X-Y plane.

Figure 14:
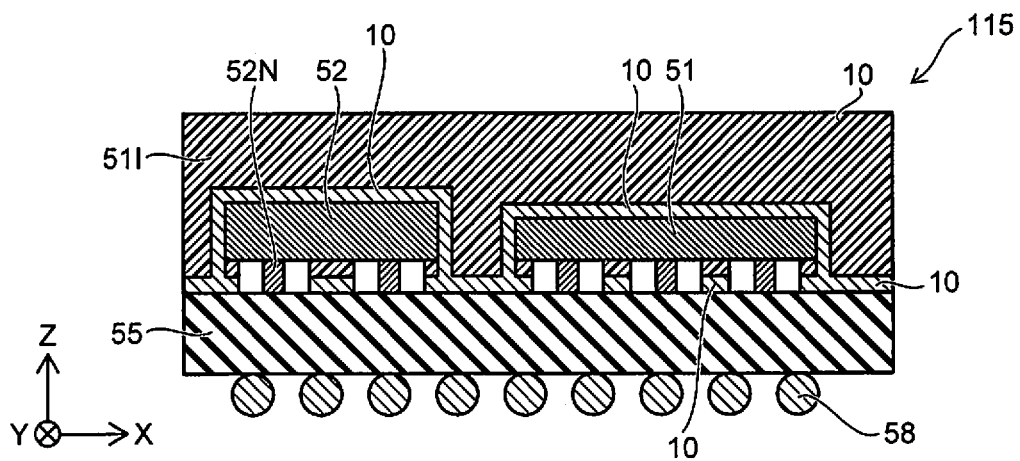
FIG. 14 is a schematic cross-sectional view illustrating electronic devices according to the second embodiment.

As in an electronic device 115 shown in FIG. 14, the electromagnetic wave attenuator 10 may be provided to continuously cover multiple electronic elements (the electronic elements 51 and 52).

Figure 15:
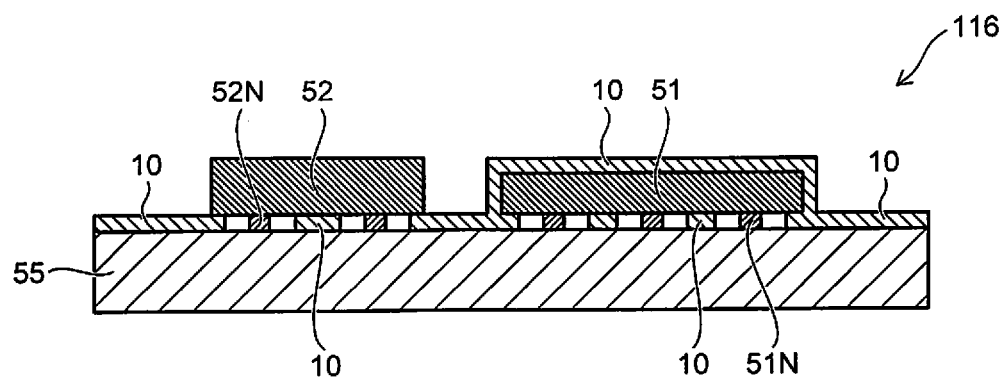
FIG. 15 is a schematic cross-sectional view illustrating electronic devices according to the second embodiment.

As in an electronic device 116 shown in FIG. 15, one of the multiple electronic elements (the electronic element 51) is provided between multiple regions of the electromagnetic wave attenuator 10. Another one of the multiple electronic elements (the electronic element 52) may not be provided between the multiple regions of the electromagnetic wave attenuator 10.

According to the electronic devices 111 to 116 as well, an electronic device can be provided in which the attenuation characteristics for electromagnetic waves can be improved.

For example, the embodiments are applicable to an electronic device and an electromagnetic wave attenuator for EMC (ElectroMagnetic Compatibility).

The embodiments may include the following configurations (e.g., technological proposals).

Configuration 1

An electromagnetic wave attenuator, comprising:
a multilayer member; and
a magnetic member,
the multilayer member including a plurality of magnetic layers and a plurality of nonmagnetic layers, the plurality of nonmagnetic layers being conductive,
a direction from one of the plurality of magnetic layers toward an other one of the plurality of magnetic layers being aligned with a first direction from the multilayer member toward the magnetic member,
one of the plurality of nonmagnetic layers being between the one of the plurality of magnetic layers and the other one of the plurality of magnetic layers,
a thickness along the first direction of the magnetic member being not less than ½ of a thickness along the first direction of the multilayer member.

Configuration 2

The electromagnetic wave attenuator according to Configuration 1, wherein the magnetic member contacts the multilayer member.

Configuration 3

The electromagnetic wave attenuator according to Configuration 1 or 2, wherein an other one of the plurality of nonmagnetic layers contacts the magnetic member.

Configuration 4

The electromagnetic wave attenuator according to Configuration 1 or 2, wherein the one of the plurality of magnetic layers contacts the magnetic member.

Configuration 5

The electromagnetic wave attenuator according to any one of Configurations 1 to 4, wherein the thickness along the first direction of the magnetic member is not less than 5 times a thickness along the first direction of the one of the plurality of magnetic layers.

Configuration 6

The electromagnetic wave attenuator according to any one of Configurations 1 to 5, wherein a thickness along the first direction of the one of the plurality of nonmagnetic layers is not more than ⅕ of the thickness along the first direction of the magnetic member.

Configuration 7

The electromagnetic wave attenuator according to any one of Configurations 1 to 6, wherein
the magnetic member includes a first member region and a second member region,
the first member region is between the second member region and the multilayer member in the first direction,
the first member region includes a plurality of first crystal grains,
the second member region includes a plurality of second crystal grains, and
an average value of sizes of the plurality of first crystal grains is less than an average value of sizes of the plurality of second crystal grains.

Configuration 8

The electromagnetic wave attenuator according to any one of Configurations 1 to 6, wherein
the magnetic member has a first member surface and a second member surface,
the first member surface is between the second member surface and the multilayer member in the first direction,
the first member surface includes a plurality of first crystal grains,
the second member surface includes a plurality of second crystal grains, and
an average value of sizes of the plurality of first crystal grains is less than an average value of sizes of the plurality of second crystal grains.

Configuration 9

The electromagnetic wave attenuator according to any one of Configurations 1 to 8, wherein
the one of the plurality of magnetic layers includes third crystal grains, and
an average value of sizes of the third crystal grains is 40 nm or less.

Configuration 10

The electromagnetic wave attenuator according to any one of Configurations 1 to 9, wherein
the one of the plurality of magnetic layers has a first magnetic layer surface opposing the one of the plurality of nonmagnetic layers,
the first magnetic layer surface includes a first top portion and a first bottom portion, and
a distance along the first direction between the first top portion and the first bottom portion is 10 nm or more.

Configuration 11

The electromagnetic wave attenuator according to any one of Configurations 1 to 9, wherein
the one of the plurality of magnetic layers has a first magnetic layer surface opposing the one of the plurality of nonmagnetic layers, the first magnetic layer surface includes a first top portion, a second top portion, and a first bottom portion, a position of the first bottom portion in a second direction is between a position of the first top portion in the second direction and a position of the second top portion in the second direction, the second direction crossing the first direction, and at least a portion of the one of the plurality of nonmagnetic layers is between the first top portion and the second top portion in the second direction.

Configuration 12

The electromagnetic wave attenuator according to any one of Configurations 1 to 5, wherein the one of the plurality of magnetic layers includes a plurality of magnetic films and a plurality of nonmagnetic films, a direction from one of the plurality of magnetic films toward an other one of the plurality of magnetic films is aligned with the first direction, one of the plurality of nonmagnetic films is between the one of the plurality of magnetic films and the other one of the plurality of magnetic films, a thickness along the first direction of the one of the plurality of magnetic films is thicker than a thickness along the first direction of the one of the plurality of nonmagnetic films, and the thickness along the first direction of the one of the plurality of nonmagnetic films is not less than 0.5 nm and not more than 7 nm.

Configuration 13

The electromagnetic wave attenuator according to Configuration 12, wherein at least a portion of the at least one of the plurality of nonmagnetic films includes at least one selected from the group consisting of Cu, Ta, Ti, W, Mo, Nb, and Hf.

Configuration 14

The electromagnetic wave attenuator according to Configuration 12 or 13, wherein at least a portion of the at least one of the plurality of magnetic films includes at least one selected from the group consisting of Co, Ni, and Fe.

Configuration 15

The electromagnetic wave attenuator according to any one of Configurations 1 to 14, wherein at least a portion of the one of the plurality of magnetic layers includes at least one selected from the group consisting of Co, Ni, and Fe.

Configuration 16

The electromagnetic wave attenuator according to Configuration 15, wherein the at least a portion of the at least one of the plurality of magnetic layers further includes at least one selected from the group consisting of Cu and Mo.

Configuration 17

The electromagnetic wave attenuator according to any one of Configurations 1 to 14, wherein at least a portion of the one of the plurality of magnetic layers includes $Fe_{100-x1-x2}^{\alpha}{}_{x1}N_{x2}$, and a includes at least one selected from the group consisting of Zr, Hf, Ta, Nb, Ti, Si, and Al.

Configuration 18

The electromagnetic wave attenuator according to any one of Configurations 1 to 17, wherein at least a portion of the one of the plurality of nonmagnetic layers further includes at least one selected from the group consisting of Cu, Al, Ni, Cr, Mn, Mo, Zr, and Si.

Configuration 19

The electromagnetic wave attenuator according to any one of Configurations 1 to 18, wherein an orientation of a magnetization of at least a portion of the one of the plurality of magnetic layers crosses an orientation of a magnetization of at least a portion of the other one of the plurality of magnetic layers.

Configuration 20

An electronic device, comprising:

the electromagnetic wave attenuator according to any one of Configurations 1 to 19; and an electronic element.

According to the embodiments, an electromagnetic wave attenuator and an electronic device can be provided in which the attenuation characteristics for electromagnetic waves can be improved.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in electromagnetic wave attenuators such as multilayer members, magnetic layers, nonmagnetic layers, magnetic members, and included in electronic devices such as electronic elements, semiconductor chips, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all electromagnetic wave attenuators, and electronic devices practicable by an appropriate design modification by one skilled in the art based on the electromagnetic wave attenuators, and the electronic devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An electromagnetic wave attenuator, comprising:
   a multilayer member; and
   a magnetic member,
   the multilayer member including a plurality of magnetic layers and a plurality of nonmagnetic layers, the plurality of nonmagnetic layers being conductive,
   a direction from one of the plurality of magnetic layers toward an other one of the plurality of magnetic layers being aligned with a first direction from the multilayer member toward the magnetic member,
   one of the plurality of nonmagnetic layers being between the one of the plurality of magnetic layers and the other one of the plurality of magnetic layers, a thickness along the first direction of the magnetic member being not less than ½ of a thickness along the first direction of the multilayer member,
wherein the magnetic member directly contacts the multilayer member.

2. The attenuator according to claim 1, wherein the other one of the plurality of nonmagnetic layers contacts the magnetic member.

3. The attenuator according to claim 1, wherein the one of the plurality of magnetic layers contacts the magnetic member.

4. The attenuator according to claim 1, wherein the thickness along the first direction of the magnetic member is not less than 5 times a thickness along the first direction of the one of the plurality of magnetic layers.

5. The attenuator according to claim 1, wherein a thickness along the first direction of the one of the plurality of nonmagnetic layers is not more than ⅕ of the thickness along the first direction of the magnetic member.

6. The attenuator according to claim 1, wherein
the magnetic member includes a first member region and a second member region,
the first member region is between the second member region and the multilayer member in the first direction,
the first member region includes a plurality of first crystal grains,
the second member region includes a plurality of second crystal grains, and
an average value of sizes of the plurality of first crystal grains is less than an average value of sizes of the plurality of second crystal grains.

7. The attenuator according to claim 1, wherein
the magnetic member has a first member surface and a second member surface,
the first member surface is between the second member surface and the multilayer member in the first direction,
the first member surface includes a plurality of first crystal grains,
the second member surface includes a plurality of second crystal grains, and
an average value of sizes of the plurality of first crystal grains is less than an average value of sizes of the plurality of second crystal grains.

8. The attenuator according to claim 1, wherein
the one of the plurality of magnetic layers includes third crystal grains, and
an average value of sizes of the third crystal grains is 40 nm or less.

9. The attenuator according to claim 1, wherein
the one of the plurality of magnetic layers has a first magnetic layer surface opposing the one of the plurality of nonmagnetic layers,
the first magnetic layer surface includes a first top portion and a first bottom portion, and
a distance along the first direction between the first top portion and the first bottom portion is 10 nm or more.

10. The attenuator according to claim 1, wherein
the one of the plurality of magnetic layers has a first magnetic layer surface opposing the one of the plurality of nonmagnetic layers,
the first magnetic layer surface includes a first top portion, a second top portion, and a first bottom portion,
a position of the first bottom portion in a second direction is between a position of the first top portion in the second direction and a position of the second top portion in the second direction, the second direction crossing the first direction, and
at least a portion of the one of the plurality of nonmagnetic layers is between the first top portion and the second top portion in the second direction.

11. The attenuator according to claim 1, wherein
the one of the plurality of magnetic layers includes a plurality of magnetic films and a plurality of nonmagnetic films,
a direction from one of the plurality of magnetic films toward an other one of the plurality of magnetic films is aligned with the first direction,
one of the plurality of nonmagnetic films is between the one of the plurality of magnetic films and the other one of the plurality of magnetic films,
a thickness along the first direction of the one of the plurality of magnetic films is thicker than a thickness along the first direction of the one of the plurality of nonmagnetic films, and
the thickness along the first direction of the one of the plurality of nonmagnetic films is not less than 0.5 nm and not more than 7 nm.

12. The attenuator according to claim 11, wherein at least a portion of the at least one of the plurality of nonmagnetic films includes at least one selected from the group consisting of Cu, Ta, Ti, W, Mo, Nb, and Hf.

13. The attenuator according to claim 11, wherein at least a portion of the at least one of the plurality of magnetic films includes at least one selected from the group consisting of Co, Ni, and Fe.

14. The attenuator according to claim 1, wherein at least a portion of the one of the plurality of magnetic layers includes at least one selected from the group consisting of Co, Ni, and Fe.

15. The attenuator according to claim 14, wherein the at least a portion of the one of the plurality of magnetic layers further includes at least one selected from the group consisting of Cu and Mo.

16. The attenuator according to claim 1, wherein
at least a portion of the one of the plurality of magnetic layers includes $Fe_{100-x1-x2}\alpha_{x1}N_{x2}$, and
α includes at least one selected from the group consisting of Zr, Hf, Ta, Nb, Ti, Si, and Al.

17. The attenuator according to claim 1, wherein at least a portion of the one of the plurality of nonmagnetic layers further includes at least one element selected from the group consisting of Cu, Al, Ni, Cr, Mn, Mo, Zr, and Si.

18. The attenuator according to claim 1, wherein an orientation of a magnetization of at least a portion of the one of the plurality of magnetic layers crosses an orientation of a magnetization of at least a portion of the other one of the plurality of magnetic layers in a plane perpendicular to the first direction.

19. An electronic device, comprising:
the electromagnetic wave attenuator according to claim 1; and
an electronic element.

* * * * *